United States Patent [19]
Tzu et al.

[11] Patent Number: 5,817,439
[45] Date of Patent: Oct. 6, 1998

[54] METHOD OF BLIND BORDER PATTERN LAYOUT FOR ATTENUATED PHASE SHIFTING MASKS

[75] Inventors: San-De Tzu, Taipei; Yi-Hsu Chen, Hsinchu; Chih-Chiang Tu, Tauyan, all of Taiwan

[73] Assignee: Taiwan Semiconductor Manufacturing Company, Ltd., Hsin-Chu, Taiwan

[21] Appl. No.: 857,166

[22] Filed: May 15, 1997

[51] Int. Cl.⁶ .................................................. G03F 9/00
[52] U.S. Cl. ............................................................. 430/5
[58] Field of Search .............................. 430/5, 322, 324, 430/311

[56] References Cited

U.S. PATENT DOCUMENTS

| | | | |
|---|---|---|---|
| 5,411,823 | 5/1995 | Okamoto | 430/5 |
| 5,565,286 | 10/1996 | Lin | 430/5 |
| 5,578,422 | 11/1996 | Mizuno et al. | 430/313 |
| 5,593,801 | 1/1997 | Yoshioka et al. | 430/5 |
| 5,656,400 | 8/1997 | Hasegawa et al. | 430/5 |
| 5,725,971 | 2/1996 | Moriuchi et al. | 430/5 |

OTHER PUBLICATIONS

Yuan et al, "Implementing Attenuated Phase Shift Mask for Contacts in Production", Microprocess Conference 1994, pp. 6796–6800.

Yoshioka et al, "Practical Attenuated Phase–Shifting Mask with a Single Layer Absorptive Shifter of MoSiO and MoSiON for ULSI Fabrication", Proc. 1993 IEEE Int. Electron Device Meeting, Wash. DC pp. 653–656.

*Primary Examiner*—S. Rosasco
*Attorney, Agent, or Firm*—George O. Saile; Stephen B. Ackerman; Larry J. Prescott

[57] ABSTRACT

A mask and method of forming a mask which minimizes the light transmission in the border regions of attenuating phase shifting masks. The mask uses square contact holes formed in the attenuating phase shifting material in the border regions. The square contact holes are located at the edge of the mask pattern region beginning at each corner of the mask pattern region and working toward the center of each side of the mask pattern region using a contact hole pitch. At the center of each side of the mask pattern region the pitch is discontinuous and a row of rectangular contact holes are formed.

24 Claims, 4 Drawing Sheets

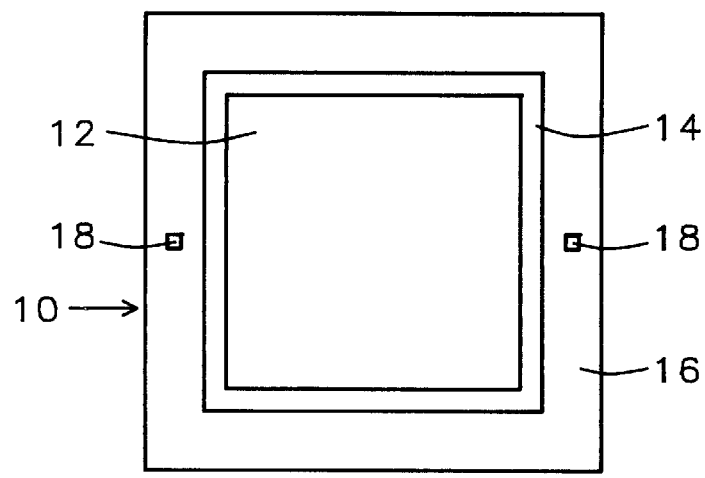
FIG. 1 - Prior Art
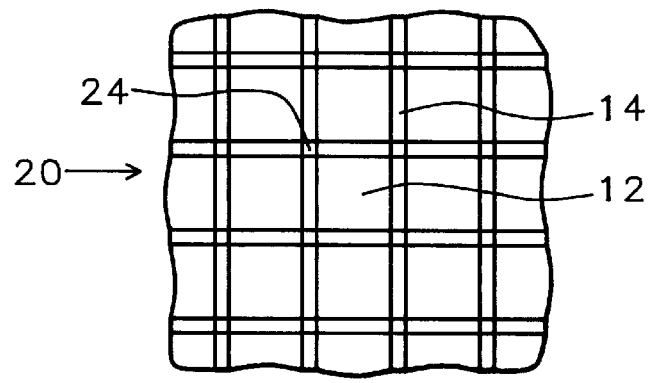
FIG. 2 - Prior Art
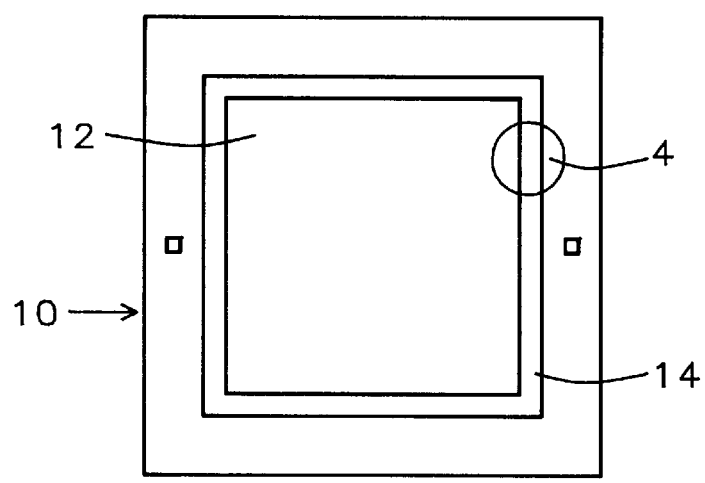
FIG. 3 - Prior Art

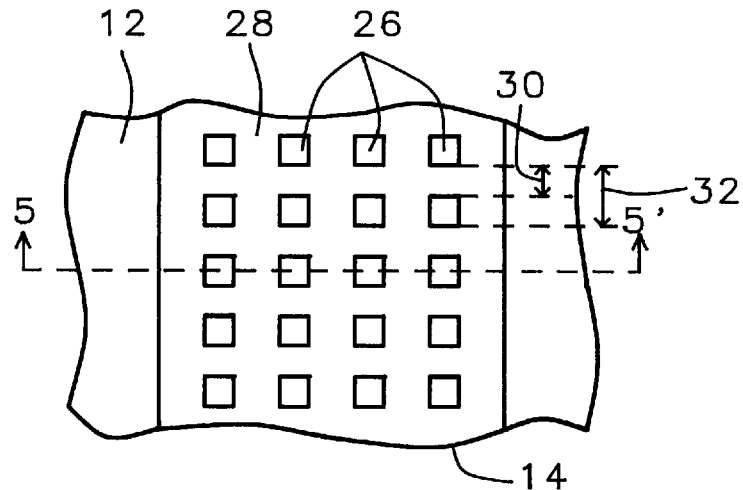
FIG. 4 – Prior Art
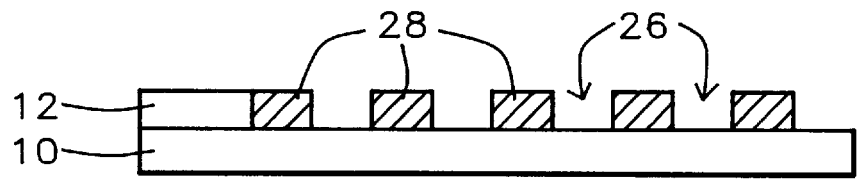
FIG. 5 – Prior Art
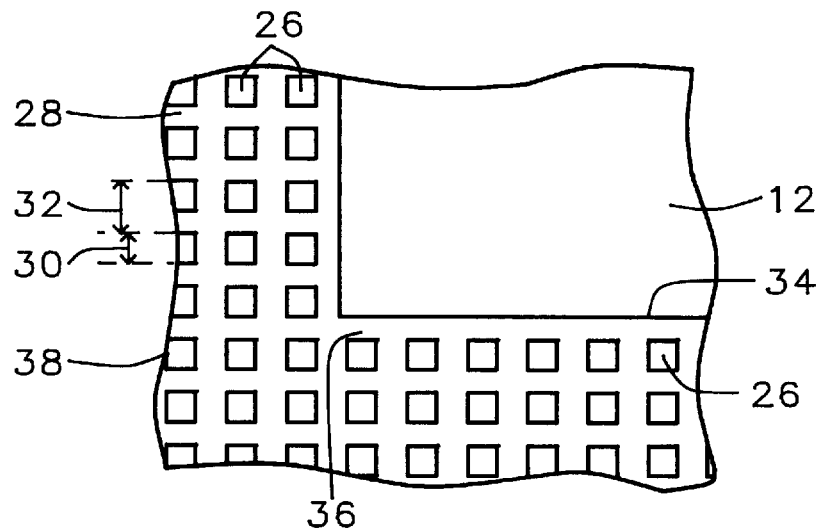
FIG. 6 – Prior Art

METHOD OF BLIND BORDER PATTERN LAYOUT FOR ATTENUATED PHASE SHIFTING MASKS

BACKGROUND OF THE INVENTION

(1) Field of the Invention

This invention relates to the formation of attenuating phase shifting masks and more particularly to the location and formation of contact holes in the attenuating phase shifting material in the mask border region of attenuating phase shifting masks to minimize light transmission through the mask border region.

(2) Description of the Related Art

U.S. Pat. No. 5,578,422 to Mizuno et al. describes a reduced exposure method for the exposure of fine patterns.

U.S. Pat. No. 5,565,286 to Lin describes an attenuated phase shifting mesh structure combined with an alternating element phase shifting mask.

U.S. Pat. No. 5,593,801 to Yoshioka et al. describes an attenuating phase shifting pattern and an attenuating phase shifting auxiliary pattern having a transmitting portion and a phase shifting portion.

This invention describes a phase shifting mask having a mask pattern region and a border region around the periphery of the mask pattern region. Systematic location of contact holes in the border region are used to minimize light transmission through the border region.

SUMMARY OF THE INVENTION

Mask patterns formed with attenuating phase shifting material are frequently used in the manufacture of integrated circuit wafers. One such mask type is shown in FIG. 1 showing a top view of a mask 10 comprising a transparent mask substrate 16, a mask pattern region 12, a border region 14, and alignment markings 18. The mask is used to form a number of images of the mask pattern region on the wafer surface, see FIG. 2. As can be seen in FIG. 2, as the image of the mask pattern region 12 is exposed on the wafer 20 the border regions 14 of the mask are exposed twice and the corner regions of the mask 24 are exposed four times. The mask border regions 14 and corner regions 24 are attenuating phase shifting material and have a light transmittance of between about 6% and 10% for light from an i line source with a wavelength of 3650 Angstroms. This double and four fold exposure at the mask borders and corners causes a loss of mask quality at the mask pattern edges and corners.

In order to reduce the light transmittance at the mask borders and mask corners contact holes are formed in the attenuating phase shifting material at the mask borders and mask corners, as can be seen in FIGS. 3 and 4. FIG. 3 shows a mask 10 having a mask pattern region 12 and a mask border region 14. An expanded view 4 of a section of the mask border region 14 is shown in FIG. 4. As can be seen in FIG. 4 the mask border region 14 is adjacent to the mask pattern region 12 and has an array of contact holes 26 formed in the attenuating phase shifting material 28. The contact holes 26 are square having a side length 30 and are located on a pitch 32. FIG. 5 shows a cross section view of the section of the mask shown in FIG. 4 taken along the line 5—5' and shows the regions of phase shifting material 28 and contact holes 26 formed on a transparent mask substrate 10. The mask pattern region 12 of the mask is adjacent to the border region.

The interference patterns caused by the contact holes in the border region of the mask effectively reduces the light transmitted by the border and corner regions and the problems due to the double and fourfold exposure at the mask borders and corners is greatly reduced. In this method the contact hole size 30 and pitch 32, see FIG. 4, are chosen to minimize the light transmission in the mask border region. A problem with this method, however, is that if the size of the mask pattern region is not an integral multiple of the pitch of the contact holes there will be gaps at least one edge of the mask pattern region. This problem can be seen in FIG. 6 showing contact holes 26 formed in the attenuating phase shifting material 28 at a corner of the mask pattern region 12. As can be seen in FIG. 6, the contact holes are square with a particular length 30 formed on a particular pitch 32. This causes an larger than desired gap 36 between one edge 34 of the mask pattern region 12 and the next row of contact holes 38. This gap will lead to problems in mask quality at this edge of the mask pattern and will cause erroneous results when used to expose photoresist on a wafer, such as resist loss or ghost images near the corner or edge of chips.

It is a principle objective of this invention to provide a method of forming a mask with contact holes in the border region which avoids these problems and provides good mask quality at the mask pattern region edge.

It is another principle objective of this invention to provide a mask with contact holes in the border region which avoids these problems and provides good mask quality at the mask pattern region edge.

These objectives are achieved by using two different contact hole sizes in the mask border region. The size and pitch of the main contact holes are chosen to minimize light transmission in the border regions. An array of the main contact holes are formed working from each corner of the mask pattern region toward the center of each side of the mask pattern region. At the center of each side of the mask pattern region rectangular secondary contact holes are formed. The rectangular secondary contact holes have a length equal to the length of the sides of the square main contact holes. The width of the rectangular secondary contact holes depends on the distance between the adjacent main contact holes and is chosen minimize light transmission.

BRIEF DESCRIPTION OF THE DRAWINGS

FIG. 1 shows a plan view of a mask showing the mask pattern region and border regions.

FIG. 2 shows a segment of a wafer exposed using the mask of FIG. 1.

FIG. 3 shows a plan view of a mask showing the mask pattern region and border regions of a mask using contact holes to reduce light transmission in the border region.

FIG. 4 shows an enlarged view of a segment of a mask border region using contact holes.

FIG. 5 shows a cross section view of the segment of the mask border region of FIG. 4.

FIG. 6 shows a segment of a mask using conventional placement of contact holes in the mask border region to reduce light transmission in the mask border region.

DESCRIPTION OF THE PREFERRED EMBODIMENTS

Figure 7:
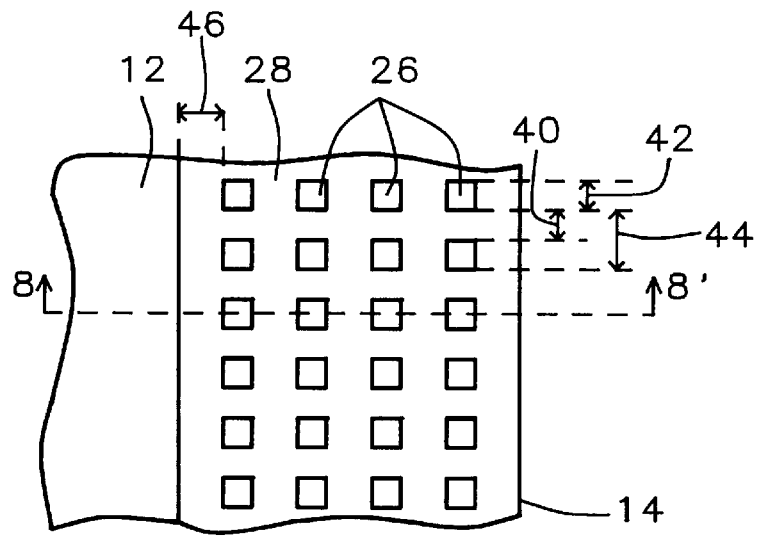
FIG. 7 shows a segment of a mask border region using the contact holes of this invention.
Figure 8:
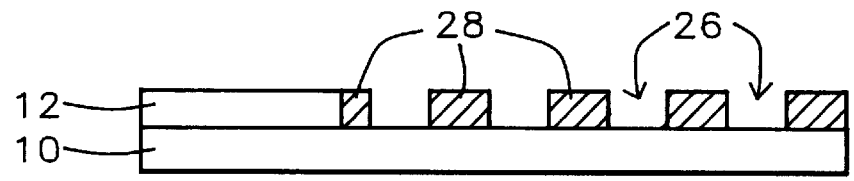
FIG. 8 shows a cross section of the segment of the mask border region shown in FIG. 8.

The preferred embodiment of the mask and method of forming the mask of this invention will now be described with reference to FIGS. 7–12. FIG. 7 shows a segment of the mask showing part of the mask pattern region 12 and the mask border region 14. The mask pattern region is a rectangle having a length of between about 75 and 120 millimeters and a width of between about 80 and 100 millimeters. The border region has a width of between about 6 and 8 millimeters. FIG. 8 shows a cross section view of the mask segment of FIG. 7 along the line 8—8'. Referring again to FIG. 7, the mask border region 14 comprises an array of square contact holes 26 formed in an attenuating phase shifting material 28 such as MoSiON. As a first step the parameters of the side length 42 of the square contact holes 26, the gap 40 between adjacent contact holes, the pitch 44 of the repeating contact hole pattern, and the distance 46 between the edge of the contact hole nearest the mask pattern region and the mask pattern region.

Computer simulation results have indicated that the light transmission is minimized, for an i line source of 3650 Angstroms wavelength, when the distance 46 between the edge of the contact hole nearest the mask pattern region and the mask pattern region is zero so that the contact holes are formed at the edge of the mask pattern region. Computer simulation results have also indicated that the length of the sides 42 of the square contact hole for minimized light transmission, using an i line source, is between about 0.8 and 1.0 micrometers. Computer simulation results have also indicated that the gap 40 between nearest sides of adjacent contact holes is between about 0.8 and 1.1 micrometers.

Figure 9:
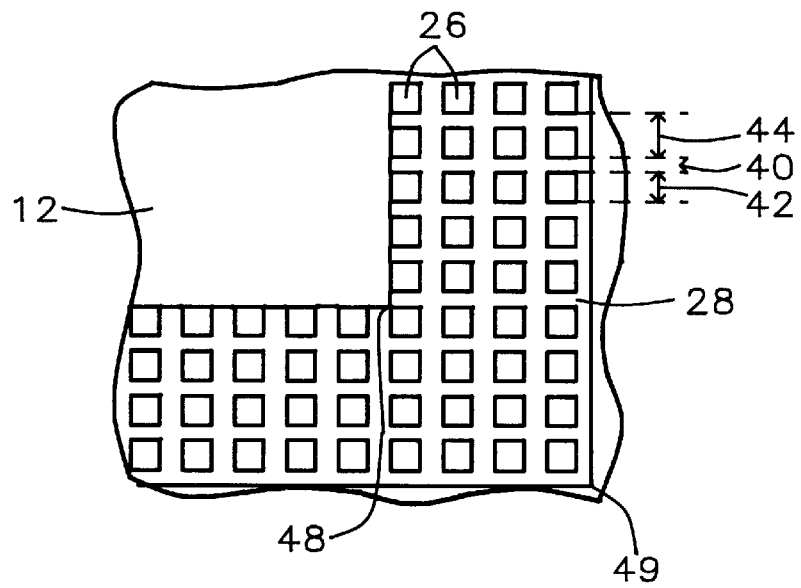
FIG. 9 shows a segment of a mask pattern region and border region using the contact holes of this invention in the mask border region.

FIG. 9 shows a view of the location of the contact holes in the border region of the mask. A row of contact holes 26 is formed at each edge of the mask pattern region 12. One contact hole is located at each corner 48 of the mask pattern region with one corner of a contact hole coincident with a corner of the mask pattern region. The contact holes 26 are then located with a contact hole edge length 42, a gap 40 between the nearest edges of adjacent contact holes, and a pitch 44 for contact hole repeating pattern working from the corner of the mask pattern region toward the center of each side of the mask pattern region. The contact hole pattern is also extended away from the corner of the mask pattern region 48 to the corner of the border region 49.

Figure 10:
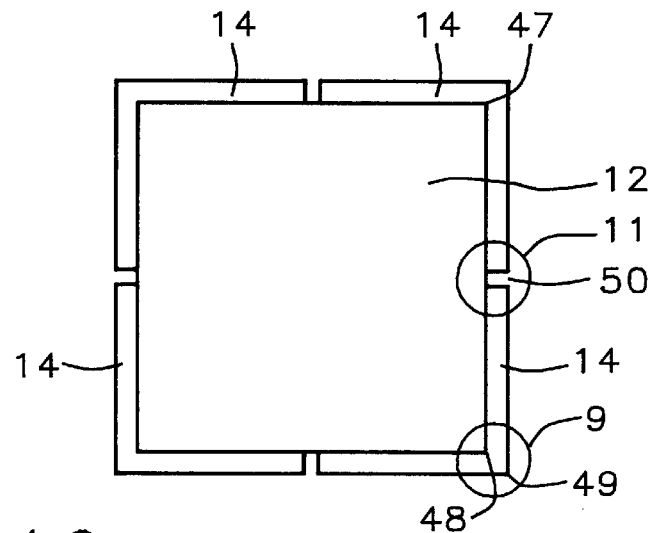
FIG. 10 shows a plan view of a mask using the contact holes of this invention in the mask border region.

FIG. 10 shows the entire mask border region around the periphery of the mask pattern region 12. At the center of each side of the mask pattern region 50 the contact hole pitch will be discontinuous and will be explained with reference to FIG. 11. A magnified view of region 9 of FIG. 10 is shown in FIG. 9. A magnified view of region 11 of FIG. 10 is shown in FIG. 11.

Figure 11:
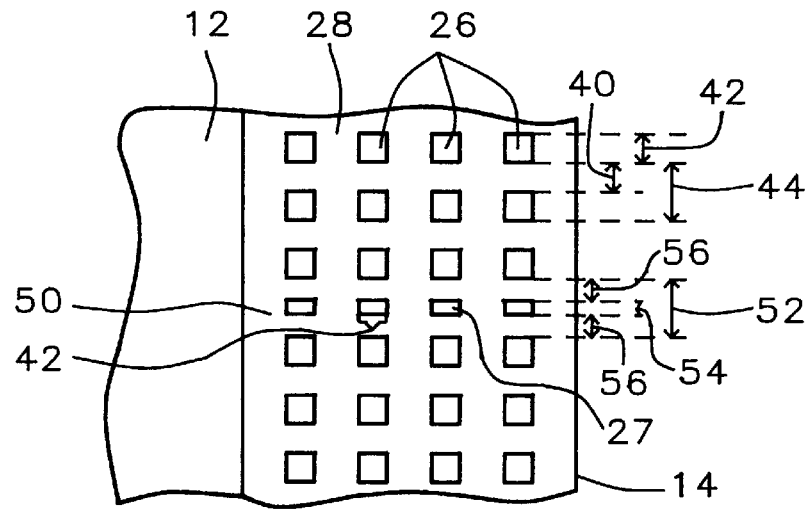
FIG. 11 shows a segment of a mask border region using the contact holes of this invention.
Figure 12:
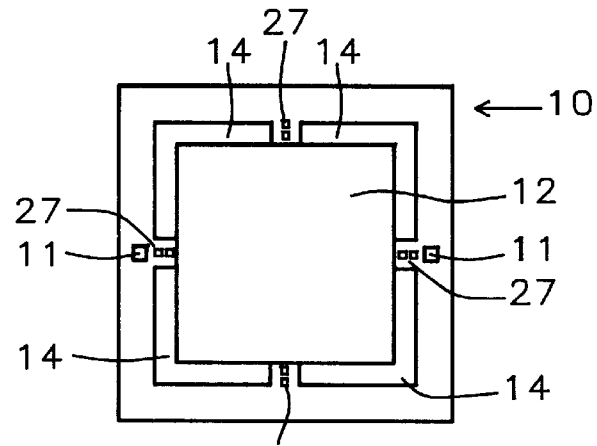
FIG. 12 shows a plan view of a mask using the contact holes of this invention in the mask border region.

Refer now to FIG. 11 for a description of the region in which the pitch becomes discontinuous. As explained above the square contact holes 26 are located on a repeating pattern with pattern pitch 44 working from opposite corners, 47 and 48 in FIG. 10, and working toward the center 50 in FIG. 10, of each side of the mask pattern region 12. This progression continues as long as the gap 52, referred to hereinafter as the critical gap, between the square contact holes nearest the center of the side of the mask pattern region will remain greater than one half of the sum of the length of the side 42 of the square contact hole and the contact hole pitch 44. When this is no longer the case no more square contact holes are located and a row of rectangular contact holes 27 are located at the center 50 of each side of the mask pattern region. The length of the critical gap 52 is dependent on the pattern size. The rectangular contact holes 27 have a length 42 equal to the length of the sides of the square contact holes 26. The width 54 of the rectangular contact holes 27 depends on the critical gap 52. For a critical gap 52 of between about 2.5 and 3.3 micrometers the width of the rectangular contact holes 54 is between about 0.8 and 1.0 micrometers. For a critical gap 52 of between about 1.2 and 2.5 micrometers the width of the rectangular contact holes 54 is between about 0.25 and 0.8 micrometers. The width 54 of the rectangular contact holes 27 can be determined from the critical gap 52 using the equation $Y=-0.174X^2+1.23X-1.17$, where Y is the width 54 of the rectangular contact holes 27 and X is the critical gap 52. FIG. 12 shows the completed mask 10 showing the mask pattern region 12 and the mask border region 14.

While the invention has been particularly shown and described with reference to the preferred embodiments thereof, it will be understood by those skilled in the art that various changes in form and details may be made without departing from the spirit and scope of the invention.

What is claimed is:

1. A method of forming a mask, comprising the steps of:

providing a transparent mask substrate;

forming a rectangular pattern region having a first side, a second side, a third side, a fourth side, and four corners on said transparent mask substrate wherein said first side and said third side have a first length, and said second side and said fourth side have a second length;

forming two first rectangular border regions of an attenuating phase shifting material on said transparent mask substrate wherein each of said first rectangular border regions has an inner side, an outer side, a first end, and a second end, said inner sides and said outer sides of said first rectangular border regions have said first length, said first ends and said second ends of said first rectangular border regions have a third length, said inner side of one of said first rectangular border regions is coincident with said first side of said rectangular pattern region, and said inner side of the other said first rectangular border region is coincident with said third side of said rectangular pattern region;

forming two second rectangular border regions of an attenuating phase shifting material on said transparent mask substrate wherein each of said second rectangular border regions has an inner side, an outer side, a first end and a second end, said inner sides and said outer sides of said second rectangular border regions have said second length, said first ends and said second ends of said second rectangular border regions have said third length, said inner side of one of said second rectangular border regions is coincident with said second side of said rectangular pattern region, and said inner side of the other said second rectangular border region is coincident with said fourth side of said rectangular pattern region;

forming four square border regions of an attenuating phase shifting material on said transparent mask substrate, each said square border region having four corners, wherein the sides of each of said square border regions has said third length, one corner of each of said square border region is coincident with one of said four corners of said rectangular pattern region, no part of each of said square border regions overlaps any part of another said square border region, no part of each of said square border regions overlaps any part of either of said first rectangular border regions, and no part of each of said square border regions overlaps any part of either of said second rectangular border regions;

forming N rows, where N is two multiplied by the largest positive integer less than or equal to the quantity of a fourth length subtracted from said first length divided by the quantity of a fifth length multiplied by two, of square contact holes in said attenuating phase shifting material in each of said first rectangular border regions by removing said attenuating phase shifting material from said square contact holes wherein the sides of said square contact holes have a sixth length, said fourth length is equal to said sixth length subtracted from said fifth length, one half of said N rows are located beginning said fourth length from said first end of each of said first rectangular border regions and every fifth length thereafter, one half of said N rows are located beginning said fourth length from said second end of each of said first rectangular border regions and every said fifth length thereafter, and the distance between the nearest sides of adjacent said square contact holes in the same row is said fourth length;

forming a row of first rectangular contact holes having a width equal to said sixth length and a length equal to a seventh length in each of said first rectangular border regions at the midpoint between said first end and said second end of each of said first rectangular border regions wherein the distance between the nearest sides of the two said square contact holes adjacent to one of said first rectangular contact holes is an eighth length;

forming M rows, where M is two multiplied by the largest positive integer less than or equal to the quantity of said fourth length subtracted from said second length divided by the quantity of said fifth length multiplied by two, of said square contact holes in said attenuating phase shifting material in each of said second rectangular border regions by removing said attenuating phase shifting material from said square contact holes wherein one half of said M rows are located beginning said fourth length from said first end of said second rectangular border region and every fifth length thereafter, one half of said M rows are located beginning said fourth length from said second end of said second rectangular border region and every fifth length thereafter, and the distance between the nearest sides of adjacent said square contact holes in the same row is said fourth length;

forming a row of second rectangular contact holes having a width equal to said sixth length and a length equal to a ninth length in each of said second rectangular border regions at the midpoint between said first end and said second end of each of said second rectangular border regions wherein the distance between the nearest sides of the two said square contact holes adjacent to one of said second rectangular contact holes is a tenth length; and forming a number of said square contact holes in each of said square border regions wherein the distance between the nearest sides of adjacent said square contact holes is said fourth length.

2. The method of claim 1 wherein said attenuating phase shifting material is MoSiON.

3. The method of claim 1 wherein said fourth length is between about 0.8 and 1.1 micrometers.

4. The method of claim 1 wherein said fifth length is between about 1.6 and 2.1 micrometers.

5. The method of claim 1 wherein said sixth length is between about 0.8 and 1.0 micrometers.

6. The method of claim 1 wherein said seventh length and said ninth length are each between about 0.4 and 0.9 micrometers.

7. The method of claim 1 wherein said eighth length and said tenth length are each between about 1.2 and 3.3 micrometers.

8. The method of claim 1 wherein said seventh length is equal to the quantity of the sum of 1.17 and 0.174 multiplied by the square of said eighth length subtracted from 1.23 multiplied by said eighth length.

9. The method of claim 1 wherein said ninth length is equal to the quantity of the sum of 1.17 and 0.174 multiplied by the square of said tenth length subtracted from 1.23 multiplied by said tenth length.

10. The method of claim 1 wherein said first length is between about 75 and 120 millimeters.

11. The method of claim 1 wherein said second length is between about 80 and 100 millimeters.

12. The method of claim 1 wherein said third length is between about 5 and 7 millimeters.

13. A mask, comprising:

a transparent mask substrate;

a rectangular pattern region having a first side, a second side, a third side, a fourth side, and four corners formed on said transparent mask substrate wherein said first side and said third side have a first length, and said second side and said fourth side have a second length;

two first rectangular border regions of an attenuating phase shifting material formed on said transparent mask substrate wherein each of said first rectangular border regions has an inner side, an outer side, a first end, and a second end, said inner sides and said outer sides of said first rectangular border regions have said first length, said first ends and said second ends of said first rectangular border regions have a third length, said inner side of one of said first rectangular border regions is coincident with said first side of said rectangular pattern region, and said inner side of the other said first rectangular border region is coincident with said third side of said rectangular pattern region;

two second rectangular border regions of an attenuating phase shifting material formed on said transparent mask substrate wherein each of said second rectangular border regions has an inner side, an outer side, a first end and a second end, said inner sides and said outer sides of said second rectangular border regions have said second length, said first ends and said second ends of said second rectangular border regions have said third length, said inner side of one of said second rectangular border regions is coincident with said second side of said rectangular pattern region, and said inner side of the other said second rectangular border region is coincident with said fourth side of said rectangular pattern region;

four square border regions of an attenuating phase shifting material formed on said transparent mask substrate, each said square border region having four corners, wherein the sides of each of said square border regions has said third length, one corner of each of said square border region is coincident with one of said four corners of said rectangular pattern region, no part of each of said square border regions overlaps any part of another said square border region, no part of each of said square border regions overlaps any part of either of said first rectangular border regions, and no part of each of said square border regions overlaps any part of either of said second rectangular border regions;

N rows, where N is two multiplied by the largest positive integer less than or equal to the quantity of a fourth length subtracted from said first length divided by the quantity of a fifth length multiplied by two, of square contact holes in said attenuating phase shifting material in each of said first rectangular border regions by removing said attenuating phase shifting material from said square contact holes wherein the sides of said square contact holes have a sixth length, said fourth length is equal to said sixth length subtracted from said fifth length, one half of said N rows are located beginning said fourth length from said first end of each of said first rectangular border regions and every fifth length thereafter, one half of said N rows are located beginning said fourth length from said second end of each of said first rectangular border regions and every said fifth length thereafter, and the distance between the nearest sides of adjacent said square contact holes in the same row is said fourth length;

a row of first rectangular contact holes having a width equal to said sixth length and a length equal to a seventh length in each of said first rectangular border regions at the midpoint between said first end and said second end of each of said first rectangular border regions wherein the distance between the nearest sides of the two said square contact holes adjacent to one of said first rectangular contact holes is an eighth length;

M rows, where M is two multiplied by the largest positive integer less than or equal to the quantity of said fourth length subtracted from said second length divided by the quantity of said fifth length multiplied by two, of said square contact holes in said attenuating phase shifting material in each of said second rectangular border regions by removing said attenuating phase shifting material from said square contact holes wherein one half of said M rows are located beginning said fourth length from said first end of said second rectangular border region and every fifth length thereafter, one half of said M rows are located beginning said fourth length from said second end of said second rectangular border region and every fifth length thereafter, and the distance between the nearest sides of adjacent said square contact holes in the same row is said fourth length;

a row of second rectangular contact holes having a width equal to said sixth length and a length equal to a ninth length in each of said second rectangular border regions at the midpoint between said first end and said second end of each of said second rectangular border regions wherein the distance between the nearest sides of the two said square contact holes adjacent to one of said second rectangular contact holes is a tenth length; and a number of said square contact holes in each of said square border regions wherein the distance between the nearest sides of adjacent said square contact holes is said fourth length.

14. The mask of claim 13 wherein said attenuating phase shifting material is MoSiON.

15. The mask of claim 13 wherein said fourth length is between about 0.8 and 1.1 micrometers.

16. The mask of claim 13 wherein said fifth length is between about 1.6 and 2.1 micrometers.

17. The mask of claim 13 wherein said sixth length is between about 0.8 and 1.0 micrometers.

18. The mask of claim 13 wherein said seventh length and said ninth length are each between about 0.4 and 0.9 micrometers.

19. The method of claim 13 wherein said eighth length and said tenth length are each between about 1.2 and 3.3 micrometers.

20. The mask of claim 13 wherein said seventh length is equal to the quantity of the sum of 1.17 and 0.174 multiplied by the square of said eighth length subtracted from 1.23 multiplied by said eighth length.

21. The mask of claim 13 wherein said ninth length is equal to the quantity of the sum of 1.17 and 0.174 multiplied by the square of said tenth length subtracted from 1.23 multiplied by said tenth length.

22. The mask of claim 13 wherein said first length is between about 75 and 120 millimeters.

23. The mask of claim 13 wherein said second length is between about 80 and 100 millimeters.

24. The mask of claim 13 wherein said third length is between about 5 and 7 millimeters.

* * * * *